United States Patent
Fastow et al.

(10) Patent No.: US 7,187,591 B2
(45) Date of Patent: Mar. 6, 2007

(54) MEMORY DEVICE AND METHOD FOR ERASING MEMORY

(75) Inventors: Richard Fastow, Cupertino, CA (US); Krishna Parat, Palo Alto, CA (US); Johnny Javanifard, Carmichael, CA (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 11/170,950

(22) Filed: Jun. 30, 2005

(65) Prior Publication Data

US 2007/0002620 A1    Jan. 4, 2007

(51) Int. Cl.
*G11C 16/04*    (2006.01)

(52) U.S. Cl. .......................... 365/185.33; 365/185.11; 365/185.29

(58) Field of Classification Search ............ 365/185.33
See application file for complete search history.

(56) References Cited

U.S. PATENT DOCUMENTS

| | | | |
|---|---|---|---|
| 5,144,584 A * | 9/1992 | Hoshino | 365/222 |
| 5,544,119 A | 8/1996 | Wells et al. | |
| 5,856,945 A * | 1/1999 | Lee et al. | 365/185.3 |
| 5,886,924 A * | 3/1999 | Kim et al. | 365/185.11 |
| RE37,419 E * | 10/2001 | Hsu et al. | 365/185.11 |
| 6,542,406 B2 * | 4/2003 | Byeon et al. | 365/185.13 |
| 6,876,567 B2 | 4/2005 | Chow | |
| 6,914,816 B2 * | 7/2005 | Sugiura et al. | 365/185.11 |
| 2006/0114719 A1 * | 6/2006 | Lee | 365/185.17 |

\* cited by examiner

*Primary Examiner*—Son L. Mai
(74) *Attorney, Agent, or Firm*—Marshall, Gerstein & Borun LLP

(57) ABSTRACT

A memory array includes a coupled controller for controlling the writing to, reading from and erasure of memory cells and blocks of memory cells within the memory array. The controller is operable during an erase process to determine and reduce odd/even wordline offset. The controller operates on separately settable odd/even wordline erase voltages, which are adjusted to affect offset.

20 Claims, 2 Drawing Sheets

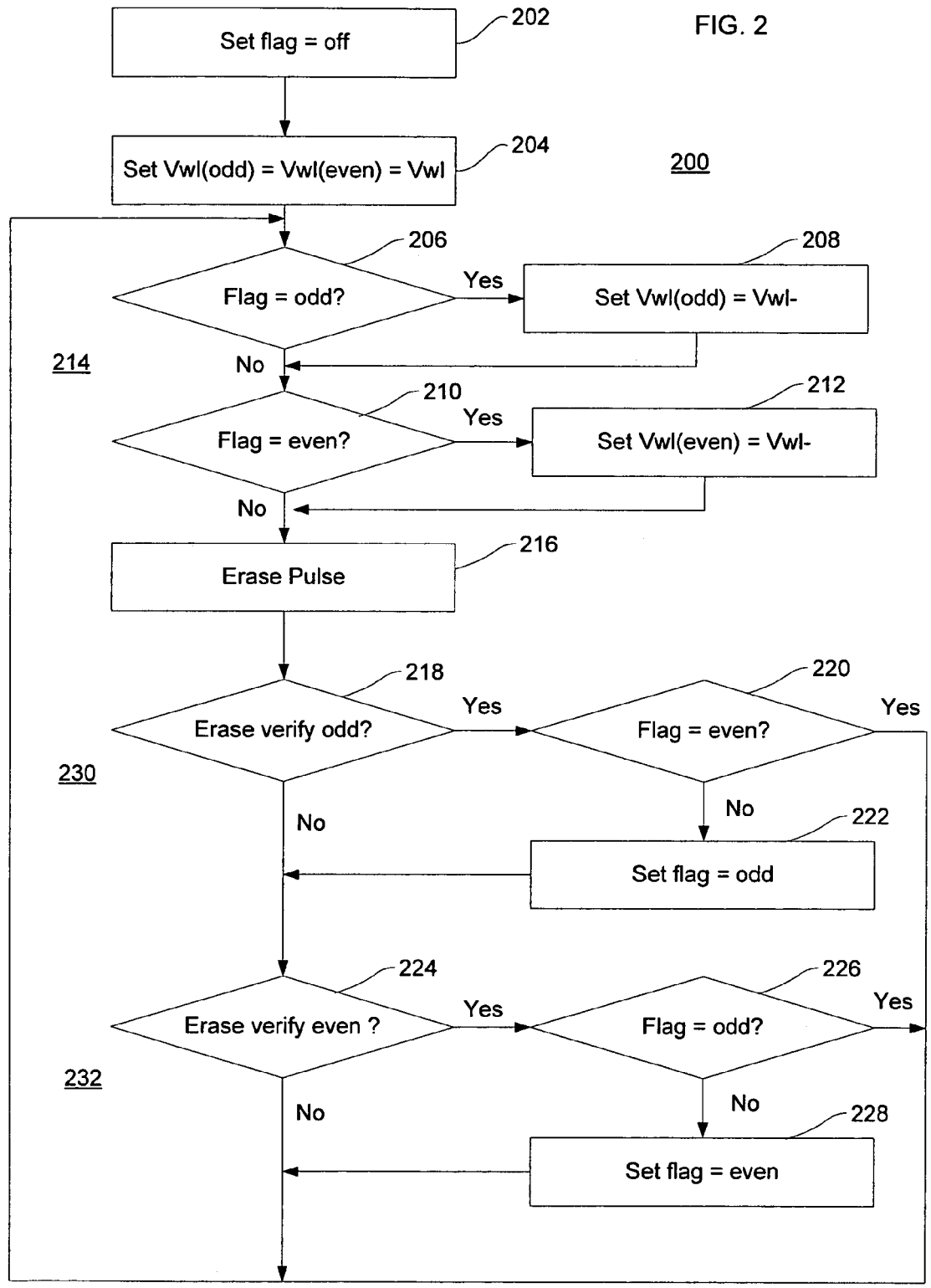

MEMORY DEVICE AND METHOD FOR ERASING MEMORY

TECHNICAL FIELD

This patent relates to memory devices, and more particularly, this patent relates to a memory device and a method for addressing odd/even wordline offset in the erase distribution.

BACKGROUND

Long term memory storage for computer systems may take the form of a flash electrically erasable programmable read only memory (EEPROM) array. Flash EEPROM memory is an array of floating gate transistors arranged as memory cells in typical row and column fashion with circuitry for accessing individual cells. The transistors of the memory cells may be set to various charge states representing data stored at the memory cell. These cells furthermore retain the set charge state even after power is removed from the array, i.e., they are stable and adaptable to long term memory applications.

The array may further be arranged with physical pairing of the blocks or sub-blocks thereof, where the paired block or sub-block is on another part of the silicon chip. The pair blocks create a logical array in which even bits/bytes/words of data are stored on respective ones of the paired blocks. The odd/even blocks may be separately read/written and erased via a corresponding controller.

The cells are erased by applying a voltage to the cells. Because of the arrangement of the array, the erase operation affects the cells of an entire block of the array. Moreover, the erase operation typically proceeds with erasing a block, i.e., a corresponding odd/even sub-block pair containing the data to be erased, the erase process being implemented by the corresponding odd/even controller, respectively, for the odd/even sub-block pair.

A typical erase operation consists of applying the voltage pulse to the block to erase the cells of the block, verifying the erase has taken place, and moving on to the next block to be erased. All of the wordlines—odd and even—are erased together. That is, they are controlled together and erased together. Because of some process artifacts, the odd and even rows may not be equivalent causing one of them, either the odd or even, to erase faster or slower then the other. That is odd/even blocks may erase faster than the corresponding even/odd blocks resulting in an offset.

BRIEF DESCRIPTION OF THE DRAWINGS

FIG. 2 is a flow chart illustrating a memory erase process in accordance with a described embodiment.

DETAILED DESCRIPTION

Figure 1:
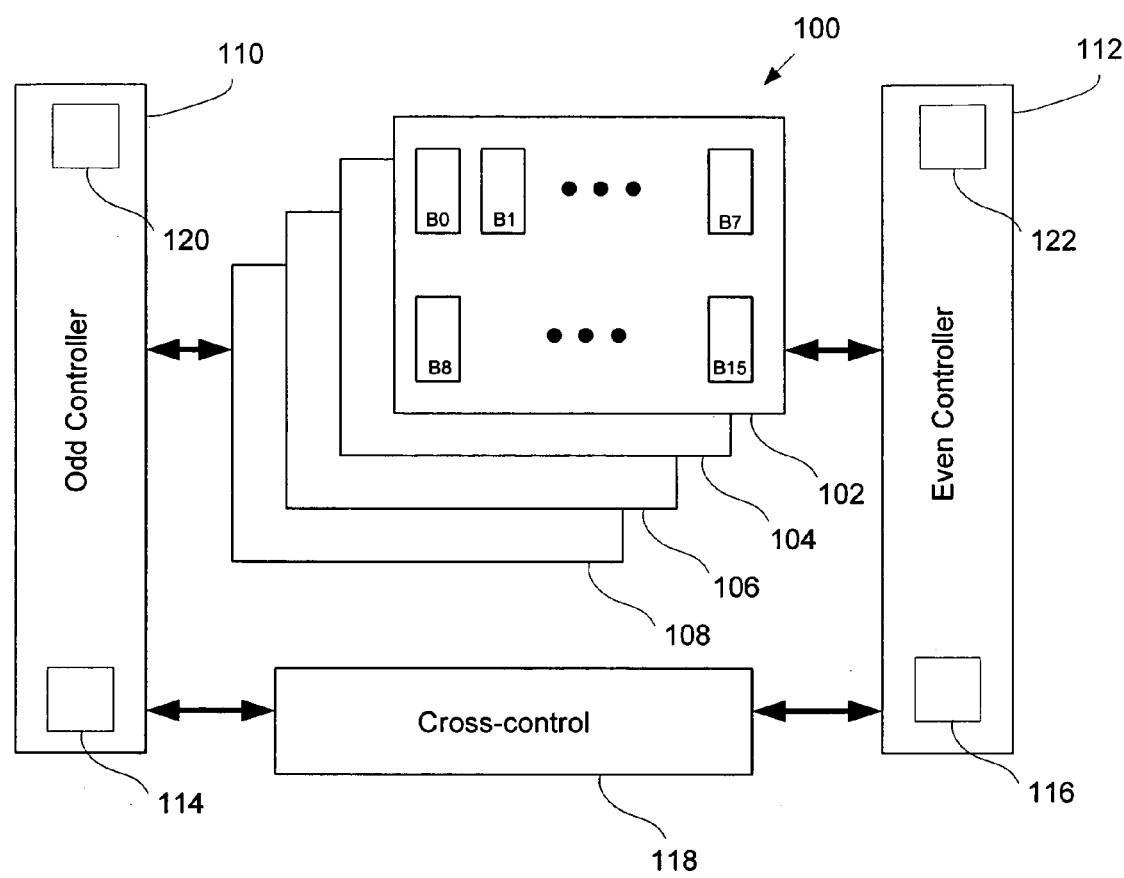
FIG. 1 is a block diagram of a portion of a memory array in accordance with a described embodiment.

A memory array includes a coupled controller for controlling the writing to, reading from and erasure of memory cells and blocks of memory cells within the memory array. The controller is operable during an erase process to determine and reduce odd/even wordline offset. In one embodiment, the controller provides separately settable odd/even wordline erase voltages. The odd/even wordline offset is affected by adjusting the odd/even wordline erase voltage to accelerate or decelerate the odd/even wordline erasure rate relative to the even/odd erasure rate to reduce and/or eliminate offset. The odd/even erase voltages may be adjusted independently or relative to each other. For example, the odd wordline voltage may be decreased relative to the even wordline voltage so that odd wordlines and even wordlines erase at substantially the same rate. Alternatively, the even wordline voltage may be increased relative to the odd wordline voltage to achieve the same affect. Each of these examples assumes odd wordline erasure is proceeding faster than even wordline erasure.

A method of erasing a memory array provides for correcting odd/even wordline offset. In accordance with an embodiment of the method, odd wordline and even wordline erase voltages are separately settable. Initially, however, each is set to a common wordline erase voltage. The odd and even wordline erase voltages are applied to the memory array as an erase pulse. Verification of the odd or even wordline erasure identifies which of odd wordline erasure or even wordline erasure is proceeding faster. The odd and even wordline voltages are then adjusted relative to wordline FIG. 1 illustrates a portion of a memory array 100 consisting of a plurality of silicon substrates 102, 104, 106 and 108 each consisting of a plurality of individually erasable memory sub-blocks, B0–B15. The sub-blocks B0–B15 are logically paired, i.e., odd/even pairs, to form logical blocks made up of two physical sub-blocks on physically separate silicon substrates as is well known in the art. An odd controller 110 couples to the memory array for use in the control of the writing to, reading from, and erasure of the corresponding odd sub-blocks. An even controller 112 couples to the memory array for use in control of the writing to, reading from, and erasure of the corresponding even sub-blocks.

The controllers 110 and 112 contain erase voltage circuits 114 and 116, respectively as well as erase verification circuits 120 and 122, respectively. The erase voltage circuits 114 and 116 are individually controllable to generate differing erase voltages for the respective odd/even sub-blocks. Similarly, the erase verification circuits 120 and 122 are independently operable to verify odd/even sub-block erasure. A cross-control 118 couples to each of the controllers 110 and 112 to receive information relating to the erase processing, and particularly the verification of odd/even sub-block erasure. The cross-control 118 is also operable to affect operation of the erase voltage circuits 114 and 116 for generating separate and different erase voltages of the odd/even sub-blocks.

While shown as part of the controllers 110 and 112, respectively, the erase voltage circuits 114 and 116 and the erase verification circuits 120 and 122 may be part of the cross-control 118, or a separate element of the memory array 100. Similarly, the controllers 110 and 112 and the cross-control 118 may be combined into a single controller or element of the memory array 100. The controllers 110 and 112 and cross-control 119 are shown separately to facilitate the description of the embodiment.

The controllers 110, 112 and the cross-control 118 contain memory incorporating an operating program for the herein described functionality, as is well known in the art. In this regard, the controllers 110, 112 and cross-control 118 implement a process for affecting erasure of blocks within the memory array 100. The memory array 100, controllers 110 and 112 and cross-control 118 may be implemented in silicon as a semiconductor memory device.

FIG. 2 illustrates in flow chart form a process 200 for affecting erasure of blocks within a memory array, such as memory array 100, in accordance with one of the herein described embodiments. The controllers 110, 112 and the cross-control 118 may implement the process 200, for example.

The process 200 begins by setting a flag to "off", block 202. Separately settable odd wordline erase voltage Vw1 (odd) and even wordline erase voltage Vw1(even) are set to a common wordline erase voltage Vw1, block 204. Blocks 206, 208, 210 and 212 define a wordline erase voltage adjustment function 214 to affect adjustment of the odd/even wordline erase voltages, and upon initiation of the process with the flag set to "off", are bypassed. An erase pulse based upon the odd/even wordline erase is generated and communicated to the memory array wordlines to be erased, block 216.

Blocks 218, 220, 222, 224, 226 and 228 verify odd/even wordline erasure and initiate adjustment of the odd/even wordline erase voltages. Blocks 218, 220 and 222 and blocks 224, 226 and 228 form an odd wordline verification function 230 and an even wordline verification function 232, respectively. While the odd wordline verification function 230 is ordered before the even wordline verification function 232, the ordering is reversible without affecting the functionality and outcome of the process.

At block 218, upon verification of odd wordline erasure as a result of the erase pulse, the flag is checked, block 220. If the flag is "off" or "odd", no action is taken. If the flag is "even" it is set to "odd", block 222. The even wordline verification function 232 operates similarly. At block 224, upon verification of even wordline erasure as a result of the erase pulse, the flag is checked, block 226. If the flag is "off" or "even", no action is taken. If the flag is "odd" it is set to "even", block 228. The odd/even verification functions 230 and 232, and the corresponding setting of the flag as "odd" or "even" provide a determination of odd/even offset. That is, the flags mark which of odd wordline erasure or even wordline erasure is proceeding faster.

After the initial pass, the wordline erase voltage adjustment function 214 becomes operable to affect adjustment of the odd/even wordline erase voltages to affect odd/even wordline erasure offset. If the flag is "odd", block 206, odd wordline erasure is proceeding faster than even wordline erasure. At block 208, the odd wordline erase voltage Vw1(odd) is reduced to a wordline erase voltage Vw1− that is less than Vw1. Alternatively, if the flag is not "odd" but "even", block 210, then even wordline erasure is proceeding faster than odd wordline erasure, and at block 212, the even wordline erase voltage Vw1(even) is reduced to the wordline erase voltage Vw1−. Alternatively, the wordline erase voltage adjustment function 214 may be configured to determine that odd/even wordline erasure is progressing slower than even/odd wordline erasure and correspondingly increase the appropriate odd/even wordline erase voltage.

While the present disclosure is susceptible to various modifications and alternative forms, certain embodiments are shown by way of example in the drawings and the herein described embodiments. It will be understood, however, that this disclosure is not intended to limit the invention to the particular forms described, but to the contrary, the invention is intended to cover all modifications, alternatives, and equivalents defined by the appended claims.

It should also be understood that, unless a term is expressly defined in this patent using the sentence "As used herein, the term '_' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Unless a claim element is defined by reciting the word "means" and a function without the recital of any structure, it is not intended that the scope of any claim element be interpreted based on the application of 35 U.S.C. §112, sixth paragraph.

We claim:

1. A memory device including a coupled controller for controlling writing to, reading from and erasure of the memory array, the memory device comprising:

a plurality of electrically erasable odd memory sub-blocks and a corresponding plurality of electrically erasable even memory sub-blocks, the odd memory sub-blocks and even memory sub-blocks being logically paired to form memory blocks within the memory array, each of the odd memory sub-blocks and even memory sub-blocks including odd memory wordlines and even memory wordlines, respectively; and the controller including an odd wordline erase voltage and an even wordline erase voltage, the odd wordline erase voltage and the even wordline erase voltage being separately settable and separately adjustable with respect to each other and a function to determine odd/even wordline erasure offset, the controller being operable responsive to determination of odd/even wordline erasure offset to adjust one or both of the odd wordline erase voltage and the even wordline erase voltage to affect a change in the odd/even wordline erasure offset.

2. The memory device of claim 1, the controller comprising an odd controller coupled to the odd memory sub-blocks, the odd controller including the odd wordline erase voltage, an even controller coupled to the even memory sub-blocks, the even controller including the even wordline erase voltage, and a cross-control coupled to the odd controller and the even controller to affect adjustment of one or both of the odd wordline erase voltage and the even word line erase voltage within the odd controller and the even controller, respectively.

3. A semiconductor device comprising the memory device of claim 1.

4. The memory device of claim 1, wherein the one of the odd wordline erase voltage and the even wordline erase voltage is decreaseable.

5. The memory device of claim 1, wherein the one of the odd wordline erase voltage and the even wordline erase voltage is increaseable.

6. The memory device of claim 1, wherein the one of the odd wordline erase voltage and the even wordline erase voltage is increaseable while the other of the odd wordline erase voltage and the even wordline erase voltage is decreaseable.

7. The memory device of claim 1, wherein the odd/even wordline erasure offset is a measure of the respective rates of erasure of odd wordlines and even wordlines of the memory device.

8. A method of erasing a memory comprising:

providing an odd wordline erase voltage and an even wordline erase voltage, the odd wordline erase voltage and the even wordline erase voltage being separately settable and separately adjustable;

setting the odd wordline erase voltage and the even wordline erase voltage to a wordline erase voltage;

applying the odd wordline erase voltage and the even wordline erase voltage to an odd wordline and an even wordline of the memory, respectively, as an erase pulse;

determining an offset between odd wordline erasure and even wordline erasure; and adjusting one of the odd wordline erase voltage and the even wordline erase voltage to provide an adjusted one of the odd wordline erase voltage and the even wordline erase voltage, the adjusted one of the odd wordline erase voltage and the even wordline erase voltage affecting the offset.

9. The method of claim 8, wherein adjusting one of the odd wordline erase voltage and the even wordline erase voltage comprises decreasing one of the odd wordline erase voltage and the even wordline erase voltage.

10. The method of claim 8, wherein adjusting one of the odd wordline erase voltage and the even wordline erase voltage comprises increasing one of the odd wordline erase voltage and the even wordline erase voltage.

11. The method of claim 8, wherein adjusting one of the odd wordline erase voltage and the even wordline erase voltage comprises decreasing one of the odd wordline erase voltage and the even wordline erase voltage and increasing the other of the odd wordline erase voltage and the even wordline erase voltage.

12. The method of claim 8, wherein adjusting one of the odd wordline erase voltage and the even wordline erase voltage comprises adjusting the one of the odd wordline erase voltage and the even wordline erase voltage by a predetermined increment.

13. The method of claim 8, comprising applying the adjusted one of the odd wordline erase voltage and the even wordline erase voltage as an erase pulse to respective odd wordlines and even wordlines of the memory.

14. The method of claim 8, wherein determining the offset comprises determining a relative rate of erasure of odd wordlines and even wordlines of the memory.

15. A control program stored on a computer readable medium for a controller associated with a memory, the control program to control operation of the controller to affect erasure of the memory, the control program comprising:

a first routine for setting separately settable odd wordline and even wordline erase voltages;

a second routine for applying the odd wordline erase voltage and the even wordline erase voltage to an odd wordline and an even wordline of the memory, respectively, as an erase pulse;

a third routine for determining an offset between odd wordline erasure and even wordline erasure; and a fourth routine for adjusting one of the odd wordline erase voltage and the even wordline erase voltage to provide an adjusted one of the odd wordline erase voltage and the even wordline erase voltage, the adjusted one of the odd wordline erase voltage and the even wordline erase voltage affecting the offset.

16. The control program of claim 15, wherein the fourth routine causes adjustment of one of the odd wordline erase voltage and the even wordline erase voltage by decreasing one of the odd wordline erase voltage and the even wordline erase voltage.

17. The control program of claim 15, wherein the fourth routine causes adjustment of one of the odd wordline erase voltage and the even wordline erase voltage by increasing one of the odd wordline erase voltage and the even wordline erase voltage.

18. The control program of claim 15, wherein the fourth routine causes adjustment of one of the odd wordline erase voltage and the even wordline erase voltage by decreasing one of the odd wordline erase voltage and the even wordline erase voltage and increasing the other of the odd wordline erase voltage and the even wordline erase voltage.

19. The control program of claim 15, wherein the fourth routine causes adjustment of one of the odd wordline erase voltage and the even wordline erase voltage by adjusting the one of the odd wordline erase voltage and the even wordline erase voltage by a predetermined increment.

20. The control program of claim 15, wherein the third routine determines the offset by determining a relative rate of erasure of odd wordlines and even wordlines of the memory.

* * * * *